United States Patent
Sippel et al.

(10) Patent No.: US 10,998,656 B2
(45) Date of Patent: May 4, 2021

(54) ELECTRICAL ASSEMBLY

(71) Applicant: Robert Bosch GmbH, Stuttgart (DE)

(72) Inventors: Bernd-Guenter Sippel, Schwieberdingen (DE); Peter Zweigle, Ditzingen (DE); Helmut Deringer, Erligheim (DE); Franco Zeleny, Besigheim (DE); Uwe Katzenwadel, Oberriexingen (DE); Jens Hoffmann, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/623,492

(22) PCT Filed: Jun. 14, 2018

(86) PCT No.: PCT/EP2018/065890
§ 371 (c)(1),
(2) Date: Dec. 17, 2019

(87) PCT Pub. No.: WO2019/020272
PCT Pub. Date: Jan. 31, 2019

(65) Prior Publication Data
US 2020/0194912 A1  Jun. 18, 2020

(30) Foreign Application Priority Data
Jul. 26, 2017 (DE) ...................... 10 2017 212 796.1

(51) Int. Cl.
*H01R 12/71* (2011.01)
*H01R 12/70* (2011.01)
(Continued)

(52) U.S. Cl.
CPC ....... *H01R 12/714* (2013.01); *H01R 12/7076* (2013.01); *H01R 13/24* (2013.01);
(Continued)

(58) Field of Classification Search
CPC .. H01R 12/714; H01R 12/7076; H01R 13/24; H01R 13/504; H05K 1/181
(Continued)

(56) References Cited

U.S. PATENT DOCUMENTS 5,120,678 A * 6/1992 Moore ................. H01L 24/83
                                                  29/840
5,720,100 A * 2/1998 Skipor ................ H01L 23/562
                                                  29/840
(Continued)

FOREIGN PATENT DOCUMENTS

CN    104170178 A    11/2014
CN    105407664 A    3/2016
(Continued)

OTHER PUBLICATIONS

International Search Report corresponding to PCT Application No. PCT/EP2018/065890, dated Sep. 17, 2018 (German and English language document) (5 pages).

*Primary Examiner* — Alexander Gilman
(74) *Attorney, Agent, or Firm* — Maginot, Moore & Beck LLP

(57) ABSTRACT

An electrical assembly for a motor vehicle transmission includes a printed circuit board (PCB), at least two contact surfaces, at least two contact elements, and a potting compound. The PCB has a component side and the two contact surfaces are arranged on the component side. The contact elements are each electrically connected by a PCB-side first end portion to one of the contact surfaces. The potting compound is arranged on the component side of the PCB, and the contact elements are partly embedded therein. The potting compound directly contacts the contact surfaces and the PCB-side end portions of the contact elements and covers the same. The contact elements protrude from the potting compound by second end portions facing away from
(Continued)

the PCB. The electrical assembly includes a chip protection frame that protrudes outward from the potting compound and forms contact chambers for the second end portions of the contact elements.

10 Claims, 2 Drawing Sheets

(51) Int. Cl.
    *H01R 13/24* (2006.01)
    *H01R 13/504* (2006.01)
    *H05K 1/18* (2006.01)
(52) U.S. Cl.
    CPC .......... *H01R 13/504* (2013.01); *H05K 1/181* (2013.01); *H05K 2201/1031* (2013.01); *H05K 2201/2018* (2013.01)
(58) Field of Classification Search
    USPC .......................................................... 439/78
    See application file for complete search history.

(56) References Cited

U.S. PATENT DOCUMENTS

| | | | | |
|---|---|---|---|---|
| 5,834,339 A * | 11/1998 | Distefano | ............. | H01L 21/561 438/125 |
| 5,844,319 A * | 12/1998 | Gamota | ............. | H01L 24/81 257/778 |
| 5,969,461 A * | 10/1999 | Anderson | ............. | H03H 9/059 310/313 R |
| 5,981,312 A * | 11/1999 | Farquhar | ............. | H01L 21/54 257/E21.501 |
| 6,391,682 B1 * | 5/2002 | Tsai | ............. | H01L 21/563 257/E21.503 |
| 6,521,480 B1 * | 2/2003 | Mitchell | ............. | H01L 21/56 257/E21.502 |
| 6,534,345 B1 * | 3/2003 | Muff | ............. | H01L 21/563 257/E21.503 |
| 6,734,540 B2 * | 5/2004 | Fritz | ............. | H01L 23/49827 257/686 |
| 6,903,451 B1 * | 6/2005 | Kim | ............. | H01L 23/525 257/678 |
| 7,005,322 B2 * | 2/2006 | Teysseyre | ............. | H01L 21/563 257/E21.503 |
| 7,074,627 B2 * | 7/2006 | Burnette | ............. | H01L 22/34 257/772 |
| 7,230,329 B2 * | 6/2007 | Sawamoto | ............. | H01L 21/56 257/685 |
| 7,239,023 B2 * | 7/2007 | Yu-Tung | ............. | H01L 23/3121 257/668 |
| 7,256,072 B2 * | 8/2007 | Shiozawa | ............. | H01L 25/105 438/109 |
| 7,323,675 B2 * | 1/2008 | Chen | ............. | H01L 27/14618 250/214.1 |
| 7,629,201 B2 * | 12/2009 | Gan | ............. | B81C 1/00269 438/106 |
| 7,675,172 B2 * | 3/2010 | Takizawa | ............. | H05K 3/305 257/738 |
| 7,728,429 B2 * | 6/2010 | Aokura | ............. | H01L 23/5386 257/734 |
| 8,012,777 B2 * | 9/2011 | Chang | ............. | H01L 33/52 438/26 |
| 8,193,647 B2 * | 6/2012 | Hsieh | ............. | H01L 24/96 257/797 |
| 8,278,746 B2 * | 10/2012 | Ding | ............. | H01L 24/24 257/686 |
| 8,291,584 B2 * | 10/2012 | Tanaka | ............. | H01L 23/49827 29/841 |
| 8,324,728 B2 * | 12/2012 | Tabrizi | ............. | H01L 23/49827 257/728 |
| 8,358,001 B2 * | 1/2013 | Yang | ............. | H01L 21/568 257/698 |
| 8,372,689 B2 * | 2/2013 | Lee | ............. | H01L 25/105 438/107 |
| 8,378,466 B2 * | 2/2013 | Chiu | ............. | H01L 24/96 257/660 |
| 8,399,305 B2 * | 3/2013 | Huang | ............. | H01L 24/32 438/127 |
| 8,405,213 B2 * | 3/2013 | Chen | ............. | H01L 21/50 257/738 |
| 8,569,894 B2 * | 10/2013 | Su | ............. | H01L 23/49816 257/778 |
| 8,624,374 B2 * | 1/2014 | Ding | ............. | H01L 24/97 257/686 |
| 8,748,755 B2 * | 6/2014 | Inoue | ............. | H03H 9/1064 174/523 |
| 8,941,222 B2 * | 1/2015 | Hunt | ............. | H01L 23/49811 257/678 |
| 9,048,221 B2 * | 6/2015 | Hasegawa | ............. | H01L 24/81 |
| 9,196,538 B2 * | 11/2015 | Hong | ............. | H01L 23/3128 |
| 9,406,658 B2 * | 8/2016 | Lee | ............. | H01L 23/5389 |
| 9,798,088 B2 * | 10/2017 | Gambino | ............. | G02B 6/4243 |
| 10,867,878 B2 * | 12/2020 | Wang | ............. | H04L 23/04 |
| 2007/0182028 A1 * | 8/2007 | Takano | ............. | H03H 9/725 257/787 |
| 2015/0096800 A1 * | 4/2015 | Gerhaeusser | ............. | F16H 61/0006 174/521 |

FOREIGN PATENT DOCUMENTS

| | | |
|---|---|---|
| DE | 10 2011 085 629 A1 | 5/2013 |
| DE | 10 2014 102 539 A1 | 8/2015 |
| DE | 10 2014 217 923 A1 | 3/2016 |
| DE | 10 2015 219 076 A1 | 4/2017 |
| JP | 2010-149209 A | 7/2010 |
| KR | 10-2009-0093672 A | 9/2009 |

* cited by examiner

ELECTRICAL ASSEMBLY

This application is a 35 U.S.C. § 371 National Stage Application of PCT/EP2018/065890, filed on Jun. 14, 2018, which claims the benefit of priority to Serial No. DE 10 2017 212 796.1, filed on Jul. 26, 2017 in Germany, the disclosures of which are incorporated herein by reference in their entirety.

BACKGROUND

In motor vehicle engineering, electronic modules for controlling a transmission are integrated on or in the transmission. The electronic modules may be designed, for example, as transmission control modules and, apart from a control circuit arranged on a printed circuit board, may also additionally comprise, for example, connector parts, sensors and contacting interfaces to actuators. Such electronic modules have electrical assemblies, which have to be integrated in an oil-filled transmission interior. For example, the electronic control circuit must be protected from the aggressive transmission fluid. For this purpose, potting compounds are also used, which are applied to the printed circuit board in order to protect the electronic control circuit. For example, known from DE 10 2011 085 629 A1 is an electronic transmission control module, which has a metallic cup-type housing and has a circuit carrier that is arranged in the cup-type housing and equipped with electronic components. For the purpose of protection against the aggressive transmission and metal chips contained therein, the circuit carrier is potted with a potting compound in the cup-type housing. Contact elements project out of the potting compound and serve partly for connection to the voltage supply, to an EC motor, to sensors and/or to a LIN or CAN bus.

SUMMARY

The disclosure relates to an electrical assembly, in particular for installing in or on a motor vehicle transmission, having a printed circuit board that has at least one component side, at least two contact surfaces arranged on the component side, having at least two contact elements, which are respectively electrically connected, by a first end portion on the printed circuit board side, to one of the contact surfaces, and having a potting compound, arranged on the component side of the printed circuit board, in which the contact elements are embedded, wherein the potting compound is in direct contact with and covers the contact surfaces and with end portions of the contact elements on the printed circuit board side, and wherein the contact elements protrude, by second end portions that face away from the printed circuit board, from the potting compound.

According to the disclosure, it is proposed to provide on the electrical assembly a chip protection frame that, by a portion that faces toward the printed circuit board, is arranged on the component side of the printed circuit board and, by a portion that faces away from the printed circuit board, protrudes outward from the potting compound, wherein the portion of the chip protection frame that protrudes outward from the potting compound forms a plurality of contact chambers, not filled with potting compound, that are respectively assigned to the contact elements, and respectively only one second end portion of a contact element is arranged in each contact chamber.

Advantageously, the electrical assembly presented here provides effective protection for the electrical contacting between a printed circuit board and electrical components arranged on the printed circuit board, for example against aggressive gear fluid and the metal chips contained therein. The electrical connection means, or contact elements, between the printed circuit board and an electrical component such as, for example, a sensor element, can have flexibly designed regions that, in order to maintain the required elasticity or mobility, cannot be completely embedded in the potting compound, since otherwise sustained electrical contacting is not guaranteed, for example in the case of temperature fluctuations. It is therefore necessary for the contact elements to have second end portions, facing away from the printed circuit board, which protrude from the potting compound. In these end portions protruding from the potting compound, the electrical conductors of various connections, having differing potentials, are necessarily exposed. By means of the solution according to the disclosure, an electrical short circuit between these end portions, which could be caused by metal chips in the gear oil or conductive reaction products, is advantageously avoided.

Effective protection of this second end portion is achieved in that the portion of the chip protection frame projecting outward from the potting compound forms a plurality of contact chambers, not filled with potting compound, that are respectively assigned to the contact elements, and in each case only one second end portion of a contact element is arranged in each contact chamber. If an electrical component is mounted on the printed circuit board and has on its side facing toward the printed circuit board at least two counter-contacts that are each contacted to the second ends of the contact elements, metal chips can only advance parallel to the surface of the printed circuit board, in the direction of the contact element, since the lower region is protected by the embedding of the first ends of the contact elements in the potting compound, and on the opposite side the mounted electrical component represents a certain protection. The contact chambers formed by the chip protection frame above the potting compound now provide effective protection against these metal, chips, and other aggressive substances, advancing parallel to the surface of the printed circuit board, in the direction of the contact element.

Advantageous designs and developments of the disclosure are made possible by the advantages contained in the dependent claims.

A first effective protective measure against advancing metal chips is created as a result of the electrical component engaging in the portion of the chip protection frame that protrudes outward from the potting compound. In the remaining gap between the electrical component and the chip protection frame, the metal chips have to change direction several times, such that a simple linear advance and flushing of the contact chambers in a direction parallel to the surface of the printed circuit board is not possible.

Advantageously, on its side that faces toward the printed circuit board, the electrical assembly may have a protective geometry, composed of projecting walls and/or recessed grooves, by which effective protection against migrating metal chips is also provided between the contact chambers.

Particularly advantageously, the protective geometry may be in a labyrinth-type engagement with the portion of the chip protection frame that protrudes outward from the potting compound, in such a manner that spaces, between the protective geometry and chip protection frame, that fluidically connect the contact chambers form U-shaped deflection channels.

In an embodiment variant of the disclosure, the electrical assembly may have an electrical element that is integral with the chip protection frame. In particular, in this case it may be a contact shoe having adjustable setting means, on which the counter-contacts are realized. Advantageously, this embodiment variant can be used to protect high-current connection of electrical motors, in order to electrically separate the differing potentials of the contact elements from each other.

The chip protection frame may be produced in a simple and inexpensive manner from plastic, from metal, or from a plastic-metal composite.

The electrical assembly can be used particularly advantageously as part of an electronic transmission control module or sensor module that is integrated in or on a motor vehicle transmission.

BRIEF DESCRIPTION OF THE DRAWINGS

There are shown.

DETAILED DESCRIPTION

Figure 1:
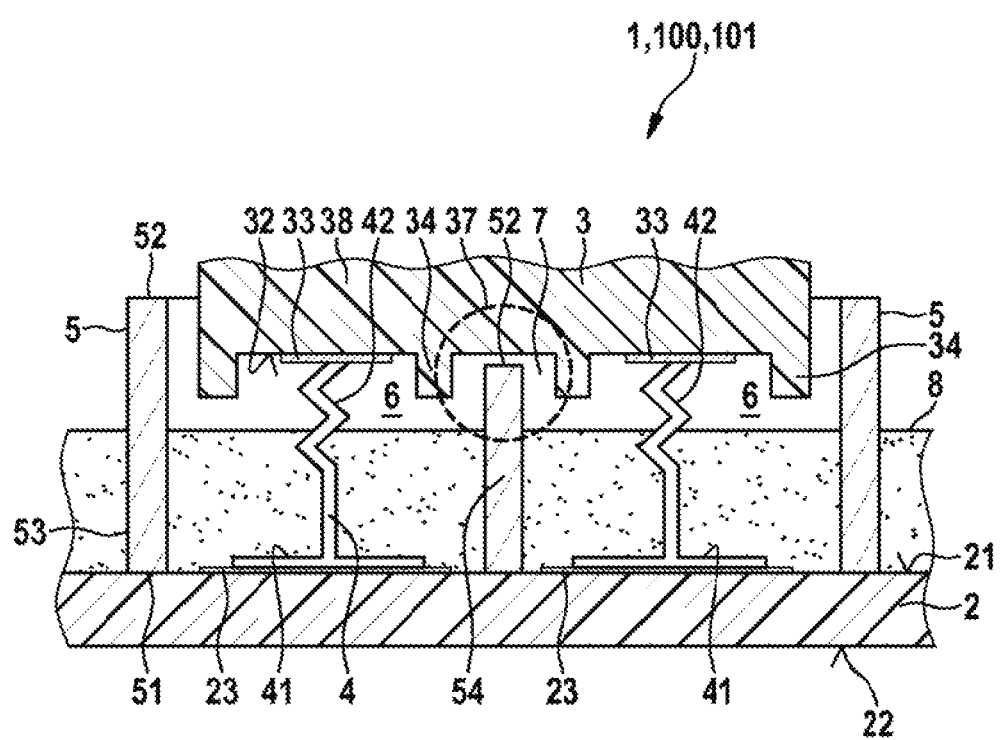
FIG. 1 a partial section through a cross section of a first exemplary embodiment of an electrical assembly, FIG. 2 a partial section through a cross section of a second exemplary embodiment of an electrical assembly FIG. 3 a partial section through a cross section of a third exemplary embodiment of an electrical assembly.

FIG. 1 shows a partial section through a cross section of a first exemplary embodiment of an electrical assembly 1. The assembly 1 may be, for example, part of an electronic control module 100, in particular a transmission control module of a motor vehicle transmission or, for example, part of a sensor module 101 that is integrated in or on a motor vehicle transmission, and therefore exposed to the transmission fluid.

The electrical assembly 1 comprises a printed circuit board 2. The printed circuit board 2 may be, for example, a conventional FR4 printed circuit board, of glass-fiber reinforced epoxy resin, having copper printed conductors arranged in one or more layers. The printed circuit board 2 has a first side that is designed as a component side 21 and, facing away from it, a second side 22. Contact surfaces 23, of which two are represented in FIG. 1, are arranged on the component side 21. The contact surfaces 21 may be composed of copper and connected, by means of the printed conductors of the printed circuit board 2, to components of the printed circuit board 2, which are not represented, for example to electronic components of an electronic control circuit, or other components. Arranged on each contact surface 23 is a respective metallic contact element 4. Each contact element 4 has a first end portion 41, on the printed circuit board 2 side, which is provided with a mounting surface for bearing contact on the assigned contact surface 23. The first end portions 41 may, for example, be soldered to the contact surfaces 23. Furthermore, the contact elements 4 each have a second end portion 42, which faces away from the first end portion and serves for contacting an electrical component 3. The second end portions 42 may preferably be spring-loaded, as indicated in FIG. 1.

Furthermore, the electrical assembly 1 comprises a chip protection frame 5. The chip protection frame 5 may be composed of plastic or metal or a plastic-metal composite. The chip protection frame 5 has an outer, full-perimeter frame 53, which is divided into chambers by partitions 54. The chip protection frame 5 is arranged, by a portion 51 that faces toward the printed circuit board 2, on the component side 21 of the printed circuit board 2. If necessary, the chip protection frame 5 may be pre-fixed by hot caulking.

There is a potting compound 8 applied to the component side 21 of the printed circuit board 2. This may be a thermoset, in particular an epoxy resin. The potting compound 8 may be applied, for example, by a so-called dam-fill method. In this case, a full-perimeter dam composed of, for example, a viscous dam material, is first applied to the component side 21, and then the potting compound 8 is then applied to the component side 21, within the region delimited by the dam. The potting compound 8 in this case may completely cover electrical components, not represented, on the component side 21.

In the region of the chip protection frame 5, the potting compound 8 is applied within the full-perimeter frame 53, this being easily performed, for example, by means of a dispensing device. The potting compound 8 in this case completely covers the first end portions 41 of the contact elements 4, and fills the space within the full-perimeter frame 53 up to a fill height that may correspond, for example, to the fill height of the potting compound 8 outside of the chip protection frame 5. In FIG. 1, the portion 52 of the chip protection frame 5 that protrudes outward from the potting compound 8 forms, for example, two contact chambers 6, not filled with potting compound 8, that are respectively assigned to the two contact elements 4. By their first end portions 41 that are in direct contact with the potting compound 8, the contact elements 4 are embedded therein, and protrude, by their second end portions 52 that face away from the printed circuit board 2, outward from the potting compound 8. The region protruding from the potting compound 8 may be realized, for example, as a spring element. Only one second end portion 42 of a contact element 4 is arranged, respectively, in each of the two contact chambers 6. It is understood that there may also be more than two contact elements 4, and more than two contact chambers 6. Likewise, there may be more than only one partition 54, and also intersecting partitions. The outer, full-perimeter frame 53, together with all partitions 54 arranged therein, forms, for each contact element 4, a respective contact chamber 6 that continuously surrounds and thereby protects the respective second end portion 42. In addition, the chip protection frame 5 is fastened to the printed circuit board 2 in a mechanically reliable manner by the potting compound 8.

As also shown in FIG. 1, an electrical component 3 engages in the portion 52 of the chip protection frame 5 that protrudes outward from the potting compound 8. The electrical component 3 may be, for example, a sensor component 38. On its side 32 that faces toward the printed circuit board 2, the electrical component 3 has at least two counter-contacts 33, which are respectively contacted to the second end portions 42 of the contact elements 4. The two end portions 42 in this case press resiliently against the respective counter-contacts 33. On its side 32 that faces toward the printed circuit board 2, the electrical component 3 has a protective geometry 37, for example two projecting walls 34, between which a middle partition. 54 of the chip protection frame 5 engages at a distance. It can be seen in FIG. 1 that the protective geometry 37 is in a labyrinth-type engagement with the portion 52 of the chip protection frame 5 that protrudes outward from the potting compound 8, in such a manner that spaces, between the protective geometry 37 and the chip protection frame 5, that fluidically connect the contact chambers 6 form U-shaped deflection channels 7 that, for example in FIG. 1, prevent a metal chip from being able to pass from the contact chamber 6 on the left into the contact chamber on the right.

Figure 2:
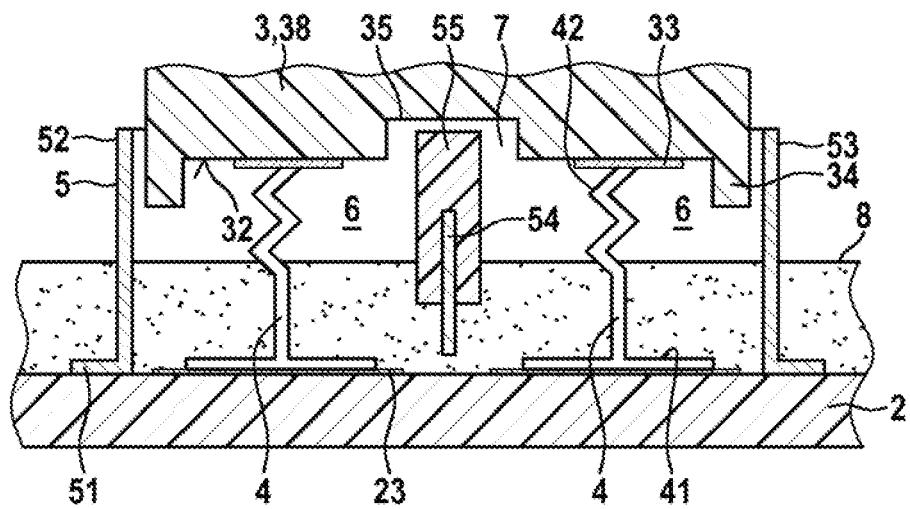

FIG. 2 shows a second exemplary embodiment, in which the chip protection frame 5 is formed from metal. A partition

54 is additionally encapsulated with a plastic thickening. In this exemplary embodiment, on its side 32 that faces toward the printed circuit board 2, the electrical component 3 has a protective geometry 37 composed, for example, of a recessed slot 35, in which the middle partition 54 of the chip protection frame 5 engages, such that, here also, a U-shaped deflection channel 7 is formed.

Figure 3:
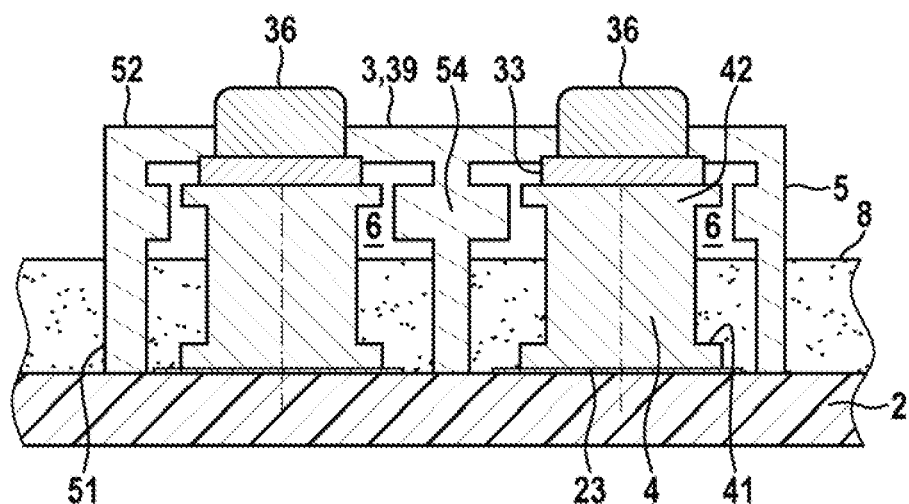

FIG. 3 shows an exemplary embodiment having a modified design. Here, a contact shoe 39 is arranged, as an electrical component 3, on the potting compound 8. The contact shoe 39 has adjustable setting means 36, on which the counter-contacts 33 are realized. The setting means 36 may be, for example, screws. As can be seen in FIG. 3, in this exemplary embodiment the electrical component 3 is integral with the chip protection frame 5. It may be, but need not be, designed to fluidically separate each contact chamber 6 from the adjacent contact chambers. During potting of the printed circuit board 2, the potting compound 8 may penetrate, for example through closable openings, not represented, into the region within the chip protection frame 5, and come into direct contact with the contact elements 4. Here, the contact elements 4 are formed by compact metal stubs, which can conduct high currents and are directly encompassed laterally, or flanked, by the potting compound 8. Here, also, protruding out of the potting compound 8 is a second end portion 42 of the contact elements 4, each respectively arranged in a contact chamber 6. The counter-contacts 33 can be pressed against the second end portions 42 of the contact elements 4 by means of the adjustable setting means 36.

The invention claimed is:

1. An electrical assembly, comprising:
   a printed circuit board that has at least one component side;
   at least two contact surfaces arranged on the component side;
   at least two contact elements that are respectively electrically connected by a first end portion on a printed circuit board side to one of the contact surfaces;
   a potting compound, arranged on the component side of the printed circuit board, in which the contact elements are partly embedded, the potting compound directly contacting and covering the contact surfaces and the first end portions of the contact elements on the printed circuit board side, the contact elements protruding, by respective second end portions that face away from the printed circuit board, from the potting compound; and
   a chip protection frame that, by a portion that faces toward the printed circuit board, is arranged on the component side of the printed circuit board and, by a portion that faces away from the printed circuit board, protrudes outward from the potting compound,
   wherein the portion of the chip protection frame that protrudes outward from the potting compound defines a plurality of contact chambers, not filled with potting compound, that are respectively assigned to the contact elements, and respectively only one second end portion of each contact element is arranged in each contact chamber.

2. The electrical assembly as claimed in claim 1, further comprising an electrical component that, on a side that faces toward the printed circuit board, has at least two counter-contacts that are respectively contacted to the second end portions of the contact elements.

3. The electrical assembly as claimed in claim 2, wherein the electrical component engages in the portion of the chip protection frame that protrudes outward from the potting compound.

4. The electrical assembly as claimed in claim 2, wherein, on a side that faces toward the printed circuit board, the electrical component has a protective geometry composed of one or more of projecting walls and recessed slots.

5. The electrical assembly as claimed in claim 4, wherein the protective geometry is in a labyrinth-type engagement with the portion of the chip protection frame that protrudes outward from the potting compound, in such a manner that spaces, between the protective geometry and the chip protection frame, that fluidically connect the contact chambers form U-shaped deflection channels.

6. The electrical assembly as claimed in claim 2, wherein the electrical component is a sensor component.

7. The electrical assembly as claimed in claim 2, wherein the electrical component is integral with the chip protection frame.

8. The electrical assembly as claimed in claim 7, wherein the electrical component is a contact shoe having an adjustable setting member on which the counter-contacts are configured.

9. The electrical assembly as claimed in claim 1, wherein the chip protection frame is configured from plastic, metal, or a plastic-metal composite.

10. The electrical assembly as claimed in claim 1, wherein the electrical assembly is part of an electronic transmission control module or a sensor module of a motor vehicle transmission.

* * * * *